(12) United States Patent
Khachaturov

(10) Patent No.: US 11,374,387 B2
(45) Date of Patent: Jun. 28, 2022

(54) SYSTEM SUPPORTING VARIABLE SPEED DRIVE

(71) Applicant: Dmytro Khachaturov, Kharkov (UA)

(72) Inventor: Dmytro Khachaturov, Kharkov (UA)

( * ) Notice: Subject to any disclaimer, the term of this patent is extended or adjusted under 35 U.S.C. 154(b) by 589 days.

(21) Appl. No.: 16/439,732

(22) Filed: Jun. 13, 2019

(65) Prior Publication Data

US 2020/0395742 A1 Dec. 17, 2020

(51) Int. Cl.
*H02B 1/56* (2006.01)
*H02M 7/68* (2006.01)
(Continued)

(52) U.S. Cl.
CPC ............. *H02B 1/565* (2013.01); *H02M 7/68* (2013.01); *H05K 7/20* (2013.01)

(58) Field of Classification Search
CPC .... H05K 7/20; H05K 7/20909; H05K 7/1432; H05K 7/20945; H05K 5/0213;
(Continued)

(56) References Cited

U.S. PATENT DOCUMENTS

| 2017/0172016 A1* | 6/2017 | Kang | G09F 9/35 |
| 2019/0069441 A1* | 2/2019 | Khachaturov | H05K 7/20909 |

FOREIGN PATENT DOCUMENTS

| DE | 10056458 C1 * | 6/2002 | E05B 17/22 |
| WO | WO-2013037567 A1 * | 3/2013 | B01D 53/265 |

OTHER PUBLICATIONS

WO-2013037567-A1 (Translation) (Year: 2022).*
DE-10056458-C1 (Translation) (Year: 2022).*

* cited by examiner

*Primary Examiner* — Hoa C Nguyen
*Assistant Examiner* — John B Freal

(57) ABSTRACT

The invention provides the system supporting variable speed drive comprising a three-sided service cabinet embodiment. The cabinet comprising two heat exchange circuits limited by the basic elements of the cabinet embodiment, the first of which is configured to interact with an external environment and with the second heat exchange circuit, wherein the second heat exchange circuit which is configured without an ability to interact with the external environment includes a sealed cell for installing power electronics and the cell for installing a power connection and the cell for installing a measurement equipment. The cabinet comprising a dust and moisture filter, a plate heat exchanger, and a moisture removal device. The cabinet may be assembled with joined end-to-end metal sheets with curved joined ends which form strengthening ribs. The system supporting variable speed drive further comprising a cell for installing a passive filter or a filter compensation device or a capacitor bank preconfigured for compliance with variable speed drive and configured in such a way that it is dismountable in a form of a cabinet of the same height and depth as the cabinet of variable speed drive and closely aligned with the cabinet of variable speed drive. The cell for installing a power connection located on a side of the cell for installing a passive filter or a filter compensation device or a capacitor bank, wherein all connections between the cabinet of variable speed drive and the cell for installing a passive filter or a filter compensation device or a capacitor bank are made in the internal part of the embodiment.

9 Claims, 9 Drawing Sheets

(51) Int. Cl.
  *H05K 7/20* (2006.01)
  *H05K 5/02* (2006.01)
  *H05K 7/14* (2006.01)
(58) Field of Classification Search
  CPC .. H05K 5/0004; H05K 5/0008; H05K 5/0221;
    H05K 5/06; H05K 7/202; H05K 7/206;
    H02B 1/565; H02M 7/68
  See application file for complete search history.

SYSTEM SUPPORTING VARIABLE SPEED DRIVE

CROSS-REFERENCE TO RELATED APPLICATIONS

Not Applicable.

BACKGROUND OF THE INVENTION

The present disclosure generally relates to systems and devices to ensure reliable operation of variable speed drive cabinets.

In addition to the power equipment of electrical devices, supplementary elements are important to ensure the reliability and efficiency of such devices. These supplementary elements may include cooling systems, moisture removal devices, power unit protection, protection of a person from electric shock and other supplementary devices and systems.

In the field of the heat exchange, the cabinet for variable speed drive is well-known from RU 36576 to Lepyokhin et al. (2004). It includes a choke coil, which covers an inlet part of an air circuit which connects a fan unit to the air circuit in its central part. Fan provides air to the choke coil. However, this technical solution does not provide sufficient cooling of all units of the device. The design of the input part of the air circuit and radiator does not provide a high level of dust and moisture resistance. In addition, the design of the air circuit requires additional operations in the manufacture. These facts increase the cost of the device.

The cabinet for variable speed drive is well-known from RU 2239267 to Vidyakin et al. (2004). The cabinet is a case in the form of a vertically oriented rectangular parallelepiped, which is made with the ability of placing controls, display and elements of power equipment. The cabinet is equipped with a heatsink device which includes an air circuit located between the side walls of the housing. The cabinet also includes a radiator embedded into the air circuit. The disadvantages of this invention include a low degree of dust and moisture resistance, due to the design of the radiator. In addition, in this solution, the cable entry sell is located in the upper part of the cabinet above the telemetry system connection compartment. This construction reduces the ergonomic parameters of the device and increases the probability of mechanical damage to the cables.

The cooling system for variable speed drive is well-known from JP2014150283 to Schnecke et al. (2014). A power assembly includes a film capacitor, and a plastic cooler, i.e., a cooling device attached to the film capacitor. The cooling device includes an electronic component operating as a heat sink for the film capacitor to form fluid channels for circulating a cooling fluid through the cooling device, and being cooled with the cooling fluid circulating through the cooling device attached thereto. The cooling device comprises a plastic material. This solution is characterized by the use of a liquid heat exchanger which implies the need for the additional presence of such a liquid when servicing the device, and such maintenance should be accompanied by constant monitoring of the coolant level. In addition, the use of this technical solution increases the consumption of materials and the cost of the variable speed drive.

One well-known patent is RU2585130 to Klapyshevkiy et. al (2016). The invention describes an air heat exchanger. The plate heat exchanger stack contains alternating plates arranged in a stack that form flow passages. The plates include central areas and side triangular areas. The central zone of one of the alternating plates is corrugated. The central zone of another alternating plate is corrugated with soft zones. Solid flow passages are formed between the plates in the central zone. The disadvantages of the device are the following. The manufacturing technology of the heat exchanger contains additional operations of corrugation, which increases the cost of the structure and involves the use of the suitable equipment. The installation and positioning of a rectangular heat exchanger in an electrical device requires additional time and effort.

Heat sink for heat exchanger and heat exchanger comprising the heat sink are well-known from JP2017130578 to Totani et al. (2017). A heat sink includes: a plurality of fin plates each juxtaposed with a gap in a plate thickness direction; and a connection component which is arranged in a manner to intersect with the plurality of fin plates and holds the plurality of fin plates. The connection component includes: a rod-shaped base part; and a plurality of positioning salients protruding from the side face of the base part. Each fin plate has an engagement groove in which a base part between neighboring positioning salients of the connection component is inserted. Manufacturing technology of the heat exchanger contains additional operations, involving the manufacture of the connecting element, the creation of projections and grooves, which increases the cost of construction and leads to the use of special equipment. The manufacturing techniques require high precision operations, which can be accompanied by defects and require high-precision equipment and/or assembly methods. The installation and positioning of a rectangular heat exchanger in an electrical device requires additional time and effort.

Heat exchanger presented in JP2001007263 to Watling (2001) comprises almost parallel fins where a heat-conductive sheet is alternately bent into a peak and a trough. At both edges of the fin, an air guide-in end and an air discharge end are formed on both sides of the heat-exchanger. The peak is longer than the trough, so the end of at least either the air guide-in end or the air discharge end of the heat-exchanger is tapered inward from the peak toward the trough. The trough of the heat-exchanger is fitted to a heat-conductive base plate to form a heat sink assembly. The manufacturing technology of the heat exchanger contains additional operations for the manufacture of the base plate and the installation of the plates on this plate, which requires the inclusion of additional elements in the design, which increases the cost of construction. Mounting and positioning a rectangular base plate in an electrical device requires additional time and effort.

An important element of the design of variable speed drive are also various filters that prevent the penetration of moisture and dust into the cabinet. Filters with multilayer configurations used in electrical equipment are well-known (CN206585858 to Huichang et al. (2017); CN205216441 to Huabo (2016); RU2537617 to Krehbtri et al. (2015); CN202009180 to Wang (2011)). However, the manufacture and use of such devices is accompanied by the need to use additional resources, assemble the filter, position the layers, create additional mounts and provide additional mechanisms to prevent the filter layers from moving, to clean it periodically.

It is also well-known structure of a multilayer filter for an electrical cabinet, CN206686510 to Ju et al. (2017). The filter includes dirt filtrating screen, new dirt filtrating screen, new dirt filtrating screen is settled storehouse and old dirt filtrating screen to settle the storehouse and is installed respectively in the both sides of SVG power cabinet inlet air channel entry, and spool I is fixed to be set up in the storehouse is settled to new dirt filtrating screen, and the dirt filtrating screen twines on hollow sleeve I, and hollow sleeve I suit is on spool I, and hollow sleeve I's inner wall is equipped with the clearance with spool I's surface, spool II is movable to be set up in the storehouse is settled to old dirt filtrating screen, and the hand wheel is connected to spool II's bottom, and sleeve II suit is on spool II, and sleeve II's inner wall is laminated with spool II's surface. This design is characterized by the same drawbacks, as well as increased cost due to the manufacture of additional elements for storage.

An air filter (GB2532066 to Redshaw (2016)) having opposing inlet and outlet surfaces defining an air flow direction between the inlet and outlet surfaces and an open cell filter material provided between the inlet and outlet surfaces. The filter material is compressed in a direction orthogonal to the air flow direction towards the outlet surface such that a porosity of the filter material varies from a higher porosity along the inlet surface to a lower porosity along the outlet surface. Such a filter requires additional cleaning, which is complicated, not standardized and, accordingly, does not provide the possibility of designing for specific conditions of operation of electrical equipment.

Filters for electrical equipment, which use various gentle grids (CN204429010 to Dongjie et al. (2015); CN204068660 to Zhiyuan et al. (2014); CN202435746 to Li (2012)), are characterized by reduced filtration efficiency due to a decrease in the effective filtration area.

Water-blocking vent panel and air filter therefor are well-known, US20100015904A1. A housing includes a wall having an aperture and a vented panel, the vented panel including a first wall having a first side and a second side and an opening, a second wall having a first side, a second side facing the first wall first side and an opening, and a panel interior, the housing further including an air filter having an inner side and an outer side relative to the interior mounted against the second wall first side over the second wall opening with the filter inner side facing the housing interior, a water dam mounted along the filter bottom portion at the filter inner side, the water dam being higher than any water barrier mounted along the filter bottom portion outer side, whereby, any water reaching the filter bottom is substantially prevented from draining into the housing interior. The disadvantage of this device is that to ensure the increase of the effective area, additional structural elements are used which can also be damaged that reduces its reliability. In addition, the use of inclined plates in one direction only does not sufficiently provide protection against dust and moisture.

The method of removal of moisture from a sealed enclosure is well known from the application WO2013037567 (A1). At least one Peltier element is arranged on the housing such that the cold side of said element lies on the inside and the hot side faces outwards. However, the proposed method of cooling the surface of the Peltier element is not effective enough. This can lead to a decrease in the efficiency of its work, as well as the tubular system of moisture removal makes it sensitive to various pollutants.

Atmospheric humidity-lowering apparatus for electrical installation boxes and the like is known from application EP0368382(A1). This apparatus for a box or casing for corrosion- and/or moisture-sensitive equipment, comprising a heat pump constituted by a Peltier element, to be mounted in the casing and having upon current flowing through the Peltier element a cold surface, such that moisture present in the casing condenses exclusively thereon and in that means are provided for removing the moisture condensed on the cold surface to the exterior of the casing. The cooling of the surface of the Peltier element in this invention is not sufficiently effective. The tightness of the housing of the electrical device is insufficient. The design of the tubular moisture removal element can lead to its destruction during periodic freezing during operation in winter.

In addition to protecting the power unit and improving the reliability of its work, the protection of personnel from electric shock is even more important. From DE10056458C1, safety position switch with timing element for door has locking pin cooperating with ratchet opening in switch operating element released after timed delay interval is well-known. The safety position switch has an operating element with a ratchet opening and a cooperating electromagnetic locking pin, operated by a time switch with a bimetallic time delay element, for delayed release of the locking pin. The implementation of blocking with the use of such elements does not guarantee absolute safety for service personnel. Since after a predetermined time has elapsed, structural elements can still be dangerous for humans, Residual voltage, especially if there is a DC link or other storage elements in the structure is dangerous.

Thus, the devices to ensure the functioning of variable speed drive and a system as a whole require improvement.

SUMMARY OF THE INVENTION

System supporting variable speed drive comprising a three-sided service cabinet embodiment which is a vertically oriented rectangular parallelepiped and configured to provide an ability to installing tools for cooling, filtration, control, indication, power equipment elements and their connections, and includes a cell for installing a power connection and a cell for installing a measurement equipment on opposite sides.

The cabinet comprising two heat exchange circuits limited by the basic elements of the cabinet embodiment, the first of which is configured to interact with an external environment and with the second heat exchange circuit, wherein the second heat exchange circuit which is configured without an ability to interact with the external environment includes a sealed cell for installing power electronics and the cell for installing a power connection and the cell for installing a measurement equipment, where connection for heat exchange along the second circuit between said cells is provided through holes in cells frames.

The cabinet comprising a dust and moisture filter placed at an inlet of air into the cabinet along the first heat exchange circuit and includes housing which includes mounting panels, an angle bar and protective panels. Protective panels are directed perpendicularly toward a direction of the first heat exchange circuit at an outlet of the dust and moisture filter and are made with multi-directional slopes in an internal part of the dust and moisture filter housing. The protective panels include dust and moisture protective elements in a shape of bended metal barriers. In a second slope of said protective panels, said metal barriers are made perpendicularly and in parallel toward the slopes of said panels, and in a third slope, said metal barriers are made perpendicularly toward the first heat exchange circuit direction. Each first metal barrier located on the second slope of each protective panel configured to cover a part of the first heat exchange circuit passing between adjacent protective panels. Each metal barrier located in parallel to the first heat exchange circuit on an adjacent panel below the first heat exchange circuit is projected at the same point relative to the first heat exchange circuit direction as a parallel barrier of an adjacent panel located above the first heat exchange circuit.

The cabinet comprising a plate heat exchanger installed between the first and the second heat exchange circuits and comprising a housing, elements for mounting, a gasket, a plurality of parallel metal plates and a plurality of plate couplers configured to create air paths for the interaction of the heat exchange circuits and installed between the metal plates. Two air paths between at least three adjacent plates are created a first of which provides air movement in the direction of the first heat exchange circuit and prevents air movement in the perpendicular direction of the second heat exchange circuit, and a second air path provides air movement in the direction of the second heat exchange circuit and prevents air movement in the perpendicular direction of the first heat exchange circuit.

The cabinet comprising a moisture removal device installed in the second heat exchange circuit and comprising a thermoelectric device and a partially permeable drainage element configured to let moisture out and prevent moisture inside the cabinet and installed under said thermoelectric device. The moisture removal device interacts with a cooler installed in the first heat exchange circuit.

The cabinet may be assembled with joined end-to-end metal sheets with curved joined ends which form strengthening ribs.

The plate heat exchanger may include polymeric plate couplers a cross section of which has a shape of a rectangle or glass textolite plate couplers a cross section of which has a shape of an irregular figure or metal plate couplers a cross section of which has a V-shape.

The system supporting variable speed drive further comprising a cell for installing a passive filter or a filter compensation device or a capacitor bank preconfigured for compliance with variable speed drive and configured in such a way that it is dismountable in a form of a cabinet of the same height and depth as the cabinet of variable speed drive and closely aligned with the cabinet of variable speed drive. The cell for installing a power connection located on a side of the cell for installing a passive filter or a filter compensation device or a capacitor bank, wherein all connections between the cabinet of variable speed drive and the cell for installing a passive filter or a filter compensation device or a capacitor bank are made in the internal part of the embodiment.

BRIEF DESCRIPTION OF THE DRAWINGS

For a more detailed description of the embodiments, references will now be made to the following accompanying drawings.

DETAILED DESCRIPTION OF THE EMBODIMENTS

Several specific embodiments of the present disclosure will be provided below. These embodiments are only examples of the presently disclosed techniques.

Beyond that, aiming to provide a brief description of these embodiments, all features of an actual implementation may not be covered in the specification. It should be appreciated that over the course of the development of any actual implementation, as in any engineering or design project, a variety of implementation-specific decisions must be taken to achieve the developer' s specific objectives, such as compliance with system-related and business-related constraints, which may vary depending on specific aspects of an implementation. Moreover, it should be taken into account that such a development effort might be complex and time consuming, but would nevertheless be a routine undertaking of design, fabrication, and manufacture for those of ordinary skill having the benefit of this disclosure. The drawings and the description below disclose specific embodiments with the idea that the embodiments are to be viewed as an exemplification of the principles of the disclosure and do not aim to limit the disclosure to the one illustrated and described.

Figure 1:
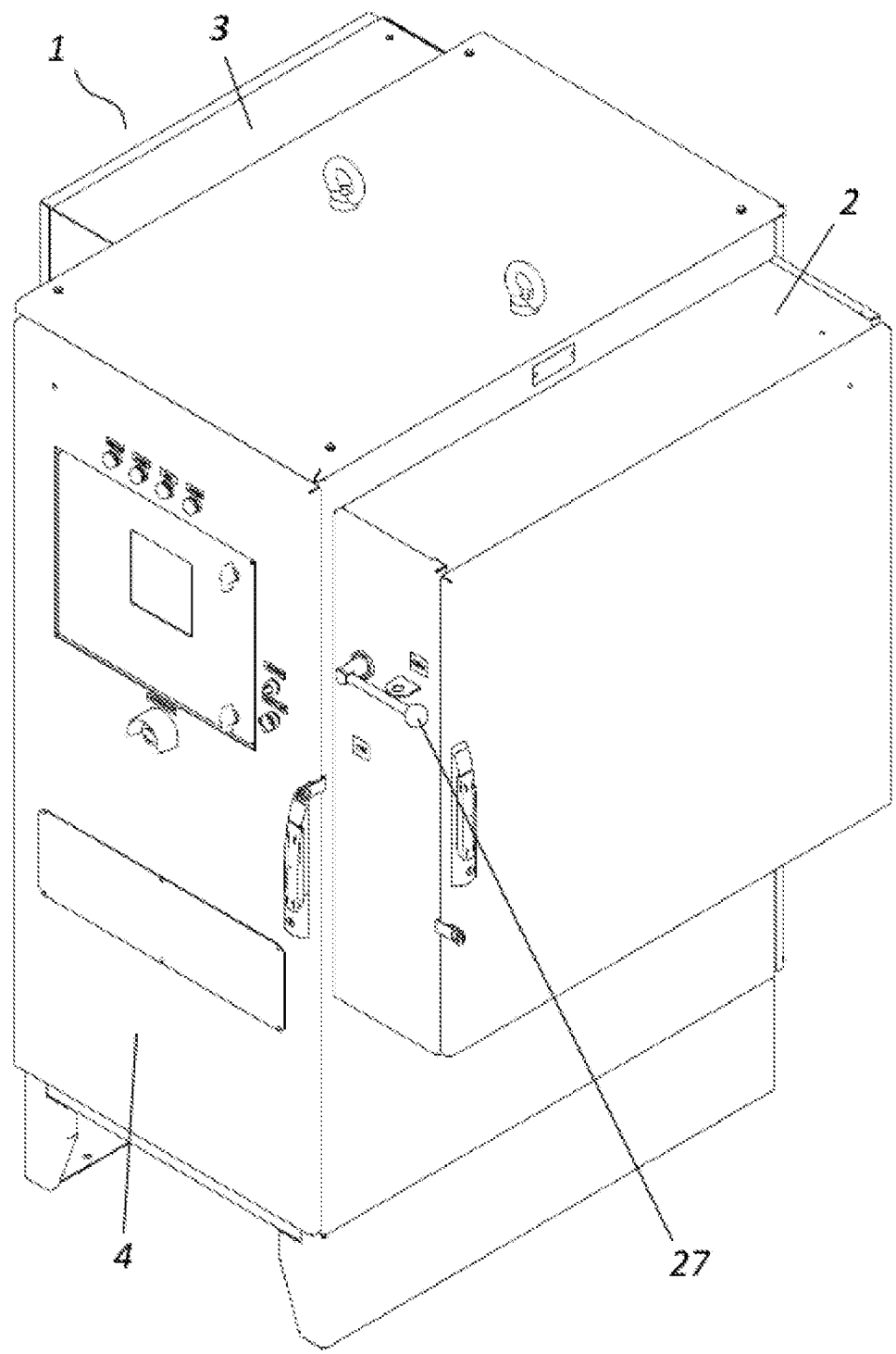
FIG. 1 illustrates a cabinet of variable speed drive according to an embodiment of the present invention.

FIG. 1 illustrates an embodiment of a system supporting variable speed drive. The system includes three-sided service cabinet 1 embodiment which is a vertically oriented rectangular parallelepiped and configured to provide an ability to installing tools for cooling, filtration, control, indication, power equipment elements and their connections, and includes a cell for installing power connection 2 and cell for installing a measurement equipment 3 on opposite sides. The main access into the cabinet is provided through door 4.

Figure 2:
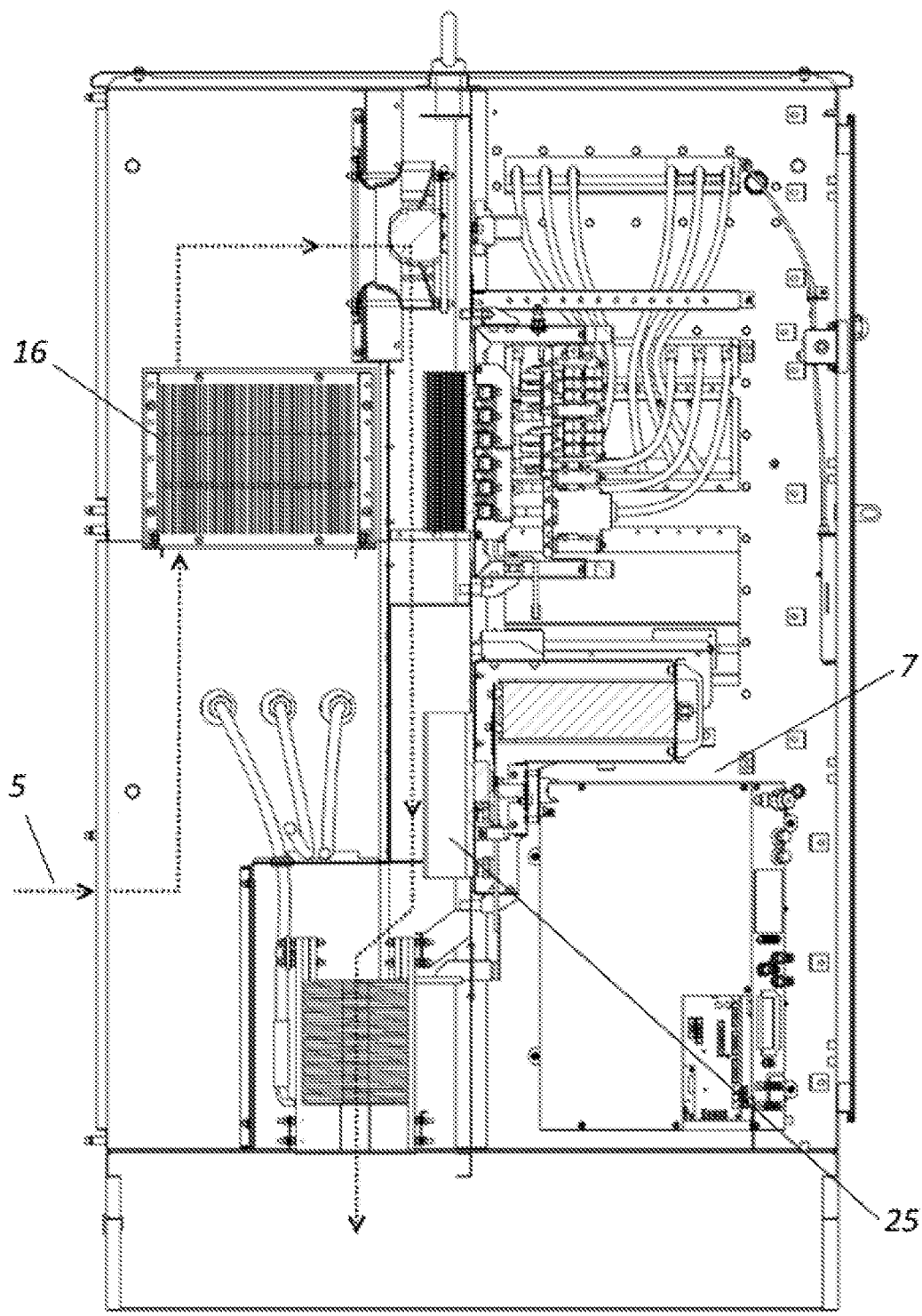
FIG. 2 illustrates a first heat exchange circuit in the cabinet with exemplary power equipment elements.
Figure 3:
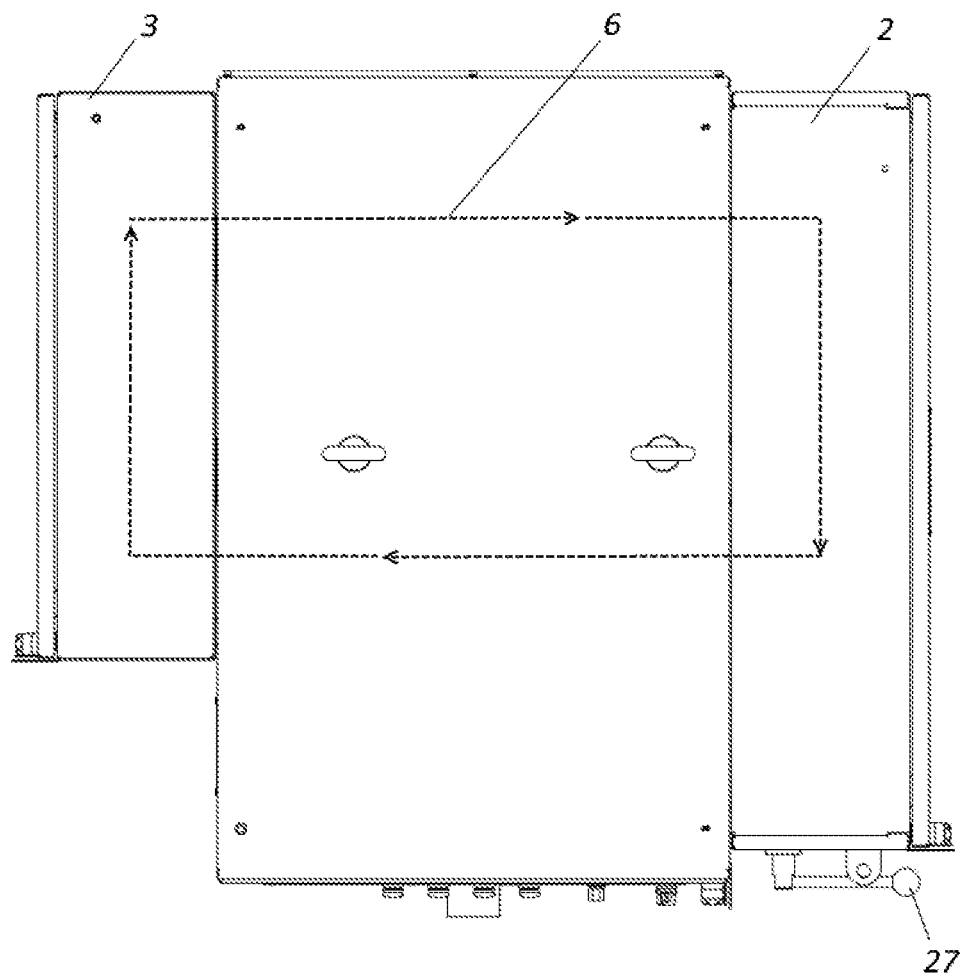
FIG. 3 illustrates a second heat exchange circuit in the cabinet.

Cabinet 1 comprises two heat exchange circuits (FIGS. 2 and 3), limited by the basic elements of the cabinet embodiment. First heat exchange circuit 5 (FIG. 2) is configured to interact with an external environment and with second heat exchange circuit 6. In the example, air from the external environment enters through a back of the cabinet, passes through it and exits through a bottom of the cabinet. Second heat exchange circuit 6 (FIG. 3) is configured without an ability to interact with the external environment. Second heat exchange circuit 6 includes sealed cell for installing power electronics 7 connection and cell 3 for installing a measurement equipment and cell for installing a power connection 2. Connection for heat exchange along second circuit 6 between cells 2, 3, 7 may be provided through holes in cells frames (not shown in FIGs).

Figure 4:
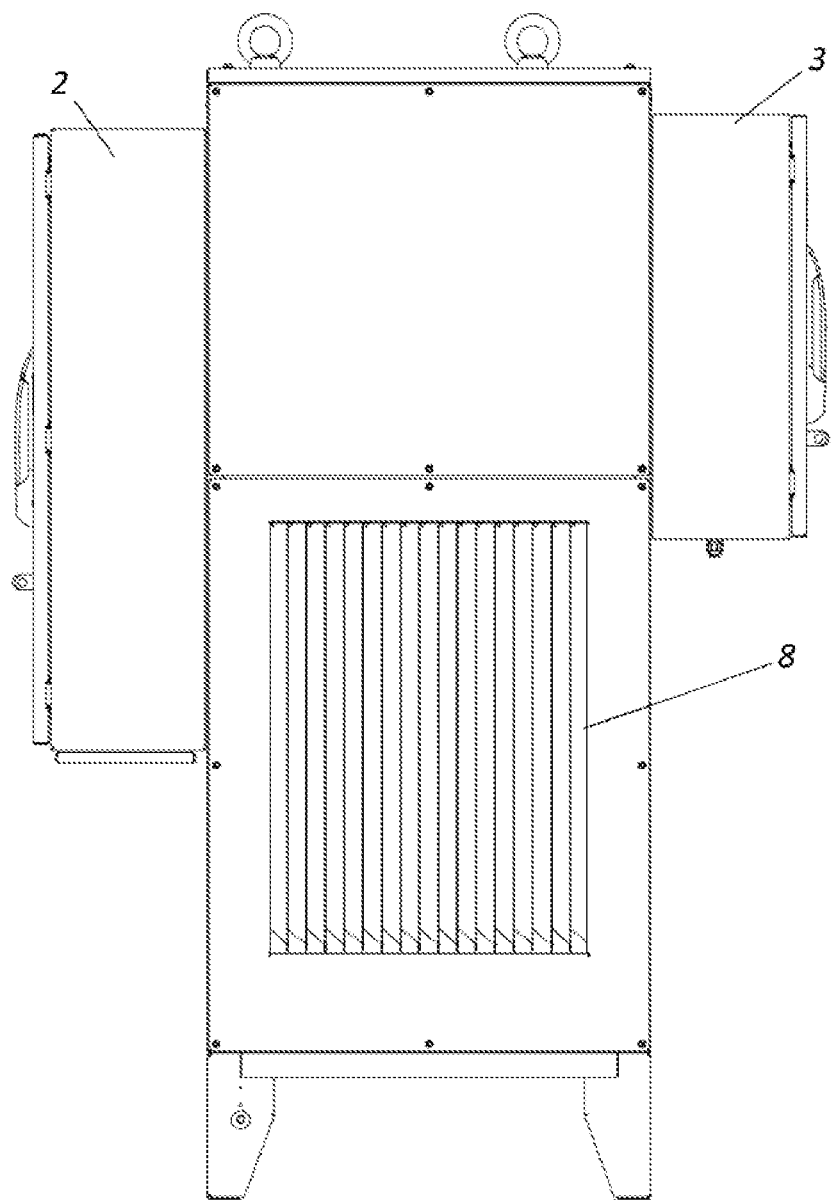
FIG. 4 illustrates a back elevation of the cabinet.
Figure 5A:
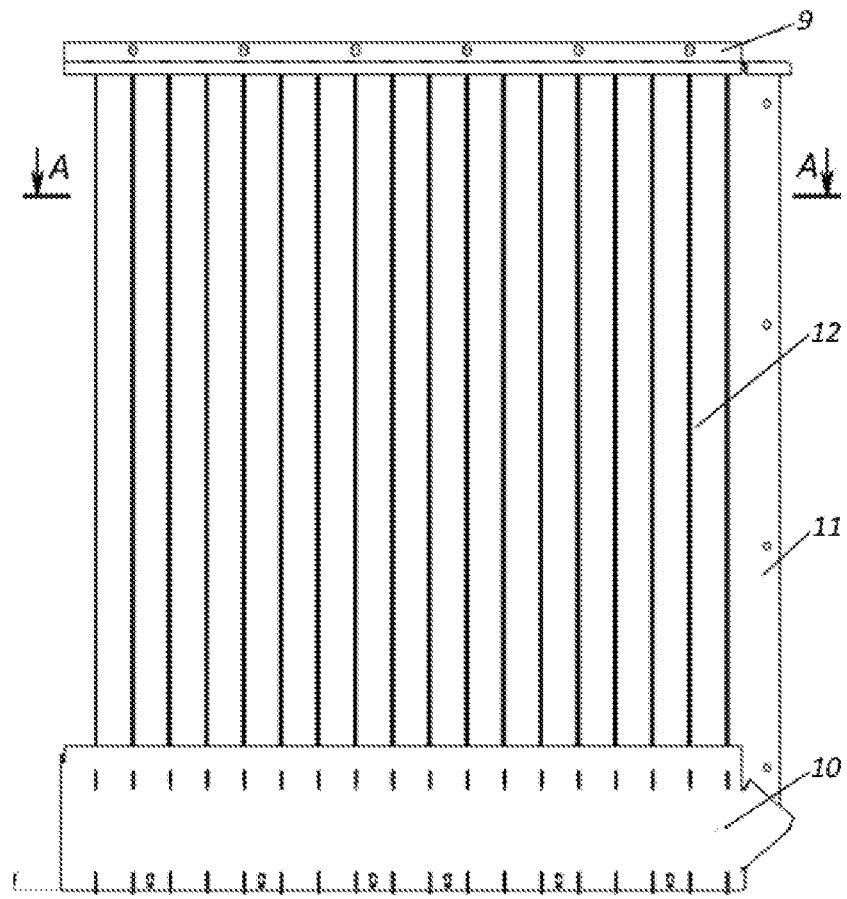
FIG. 5A illustrates a dust and moisture filter placed at an inlet of air into the cabinet.
Figure 5B:
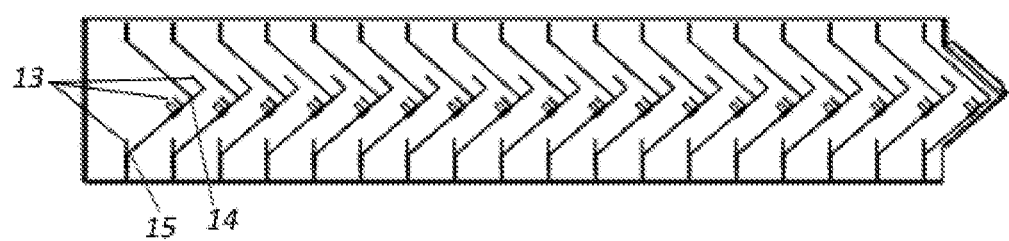
FIG. 5B illustrates section A-A regarding FIG. 5A of the dust and moisture filter.

Cabinet 1 comprises dust and moisture filter 8 (FIGS. 4, 5A, 5B) placed at an inlet of air into cabinet 1 along first heat exchange circuit 5. In the example, in FIG. 4, dust and moisture filter 8 is placed on the back of cabinet 1. Dust and moisture filter 8 includes upper 9 and lower 10 mounting plates, mounting corner 11 and protective panels 12. Protective panels 12 are directed perpendicularly toward a direction of first heat exchange circuit 5 at an outlet of the dust and moisture filter 8 (regarding air movement according to FIG. 2) and are made with multi-directional slopes in an internal part of the dust and moisture filter housing 8. Protective panels 12 include dust and moisture protective elements in a shape of bended metal barriers 13. In second slope 14 of protective panels 12, metal barriers 13 are made perpendicularly and in parallel toward the slopes of protective panels 12, and in third 15 slope, metal barriers 13 are made perpendicularly toward first heat exchange circuit 5 direction. Each first metal barrier located on second slope 14 of each protective panel 12 configured to cover a part of first heat exchange circuit 5 passing between adjacent protective panels 12. Each metal barrier located in parallel to first heat exchange circuit 5 on an adjacent panel below first heat exchange circuit 5 is projected at the same point relative to first heat exchange circuit 5 direction as a parallel barrier of an adjacent panel located above first heat exchange circuit 5.

The reliability of the system is ensured by using an undivided protective panel design with dust and moisture barriers. The need for periodic cleaning is reduced and the need for periodic replacement of filter elements is eliminated. Creating a labyrinth path of air movement increases the effective area of the device, while ensuring a sufficient level of protection of operating electrical equipment from dust and moisture by design with plurality of dust and moisture barriers in the path of air in the labyrinth and arranging them so that all air passing through the path is filtered by these barriers. In addition, the cost of construction is reduced by minimizing assembly and mounting operations.

Figure 6A:
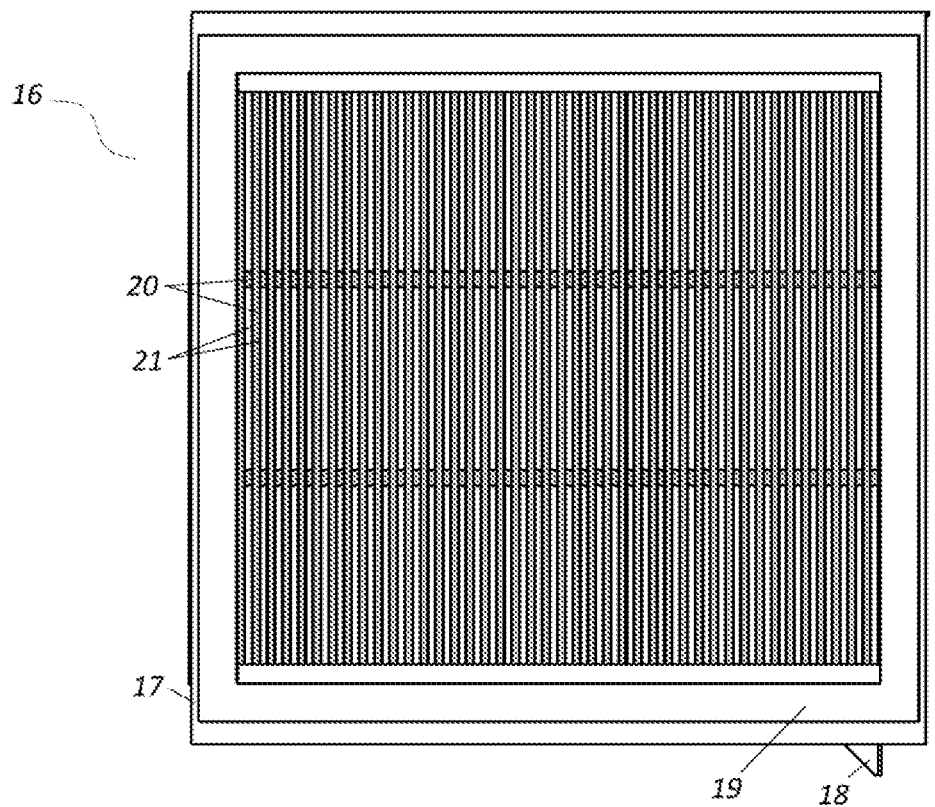
FIG. 6A illustrates a plate heat exchanger with polymeric plate couplers, a side elevation.

Cabinet 1 comprises plate heat exchanger 16 installed between first 5 and second 6 heat exchange circuits. It provides heat transfer between these heat exchange circuits. Plate heat exchanger 16 includes housing 17, elements 18 for mounting into cabinet 1, gasket 19, plurality of parallel metal plates 21 and plurality of plate couplers configured to create air paths for the interaction of heat exchange circuits 5, 6 and installed between the metal plates 21 (FIG. 6A). According to one of embodiments plate heat exchanger includes polymeric plate couplers 20 a cross section of which has a shape of a rectangle. According to other embodiment plate heat exchanger includes glass textolite plate couplers a cross section of which has a shape of an irregular figure. According to other embodiment plate heat exchanger includes metal plate couplers a cross section of which has a V-shape. The above-mentioned design options are technological, easy to manufacture, can be assembled and disassembled manually.

Two air paths between at least three adjacent plates are created. A first air path provides air movement in the direction of first heat exchange 5 circuit and prevents air movement in the perpendicular direction of second heat exchange circuit 6. A second air path provides air movement in the direction of second heat exchange circuit 6 and prevents air movement in the perpendicular direction of first heat exchange circuit 5.

Figure 6B:
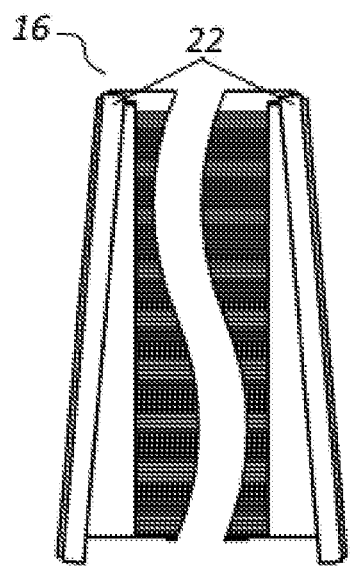
FIG. 6B illustrates plate the heat exchanger which includes chamfers for mounting it into the cabinet, a plan elevation.

According to one of embodiments plate heat exchanger 16 includes chamfers 22 for mounting it into cabinet 1, wherein the plate heat exchanger 16 with chamfers 22 is trapezoidal in shape (FIG. 6B). The trapezoidal design of plate heat exchanger 16 provides simplified installation and positioning of plate heat exchanger 16 into cabinet 1. This fact is of particular importance in the context of the need to mount lengthy and/or massive heat exchangers. Plate heat exchanger 16 can be mounted into cabinet 1, for example, using directing through shoulders (not shown in FIGs) pre-installed in cabinet 1. Such a heat exchanger is mounted from a smaller side to a larger side of a trapezoid.

Figure 7:
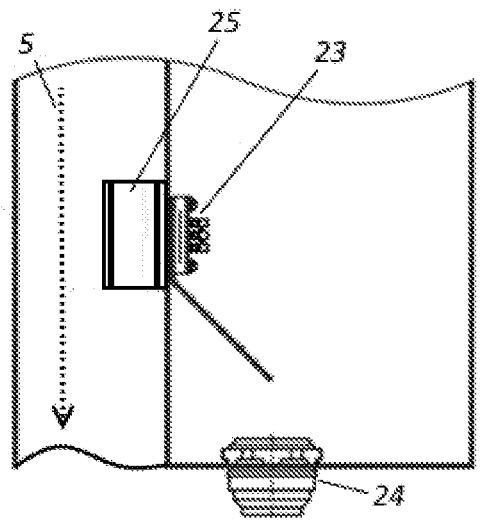
FIG. 7 illustrates a moisture removal device installed in the cabinet.

Cabinet 1 comprises a moisture removal device (FIG. 7). The moisture removal device is installed in second heat exchange circuit 6. The moisture removal device includes thermoelectric device 23 and partially permeable drainage element 24. Partially permeable drainage element 24 is configured to let moisture out and prevent moisture inside cabinet 1 and installed under thermoelectric device 23. The moisture removal device interacts with cooler 25 installed in the first heat exchange circuit 5. As a cooler any of well-known devices can be used.

Thermoelectric device 23 includes cooled and heated surfaces. Thermoelectric device 23 can operate on the principle of the Peltier Effect. Partially permeable drainage element 24 installed in the bottom of cabinet 1. Partially permeable drainage element 24 is made with the ability of removal of moisture through the influence of weight of a liquid on a vessel wall.

The heated surface of thermoelectric device 23 is cooled by a directed air flow of second heat exchange circuit 6. As a result of a significant temperature difference, the moisture contained in air inside the cabinet 1 condenses on the cooled surface of thermoelectric device 23. Condensed moisture is discharged outside cabinet without violating its integrity using at least one partially permeable drainage element 24. Through partially permeable drainage element 24 is allowed to flow out and prevented from entering the inside of cabinet 1. Moisture collected on the cooled surface of the Peltier element is directed to the zone of a hole of partially permeable drainage element 24. This solution improves the efficiency of dehumidification of air in cell for installing power electronics 7.

Figure 8:
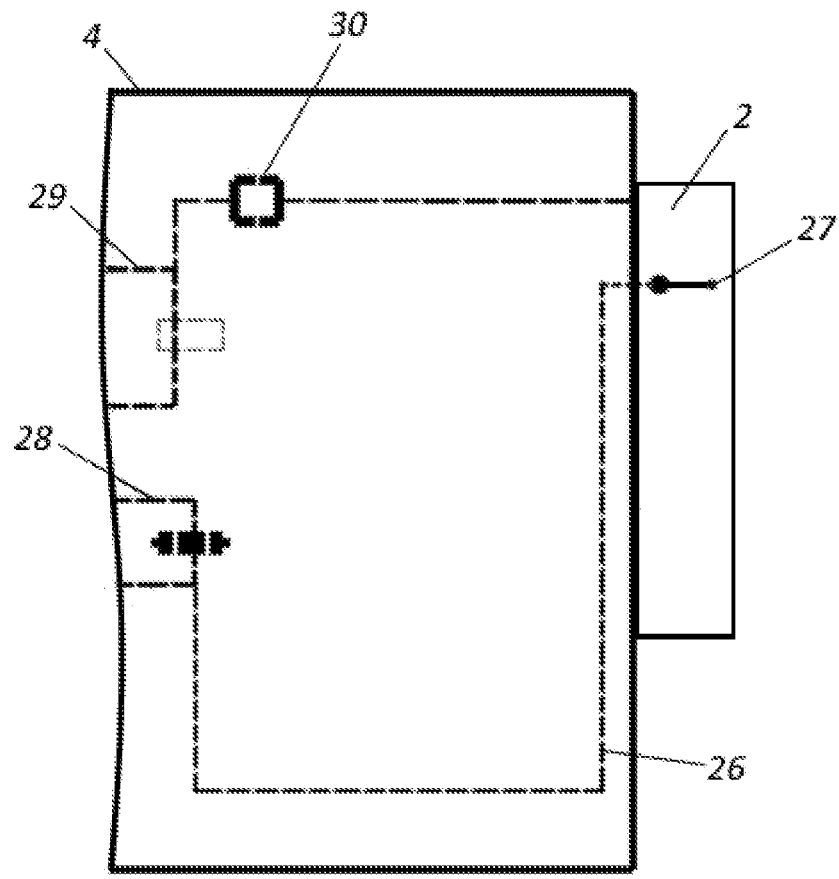
FIG. 8 illustrates schematic top door location of elements configured to block access into the cabinet.

Cabinet 1 comprises door 4 configured to block access into the cabinet before and after disconnecting a supply voltage. Locking is carried out by means of mechanical connector 26 of switcher 27 of power electronics with mechanical locking element 28 of door 4, and by means of electromechanical locking mechanism 28, and by means of power source 30 of electromechanical locking mechanism 29 (FIG. 8), and by means of door position sensors (not shown in FIGs). Mechanical locking of the door 4 can be removed only after switching off switcher 27.

Power source 30 and electromechanical locking mechanism 29 are configured to control discharge voltage and to hold door 4 locking until the voltage drops to a safe value.

Electromechanical locking mechanism 29 may be performed, for example, in the form of a solenoid. Electromechanical locking mechanism 29 may be associated, for example, with a pulse power supply. Power source 30 transmits energy only if the critical voltage is exceeded. It provides to keep electromechanical locking mechanism 29 in a closed position until the voltage drops to a level safe for humans.

Power to power source 30 can be supplied from the residual voltage on cumulative elements, for example, a DC link.

The system is equipped with door position sensors (not shown in FIGs) which do not allow supply of voltage to power elements when the door 4 is open. In the presence of supply voltage, simultaneously with mechanical locking element 28, electromechanical locking mechanism 29 of door 4 locking system is functioning.

This technical solution provides an increase in the safety of personnel and the reliability of variable speed drive.

Figure 9:
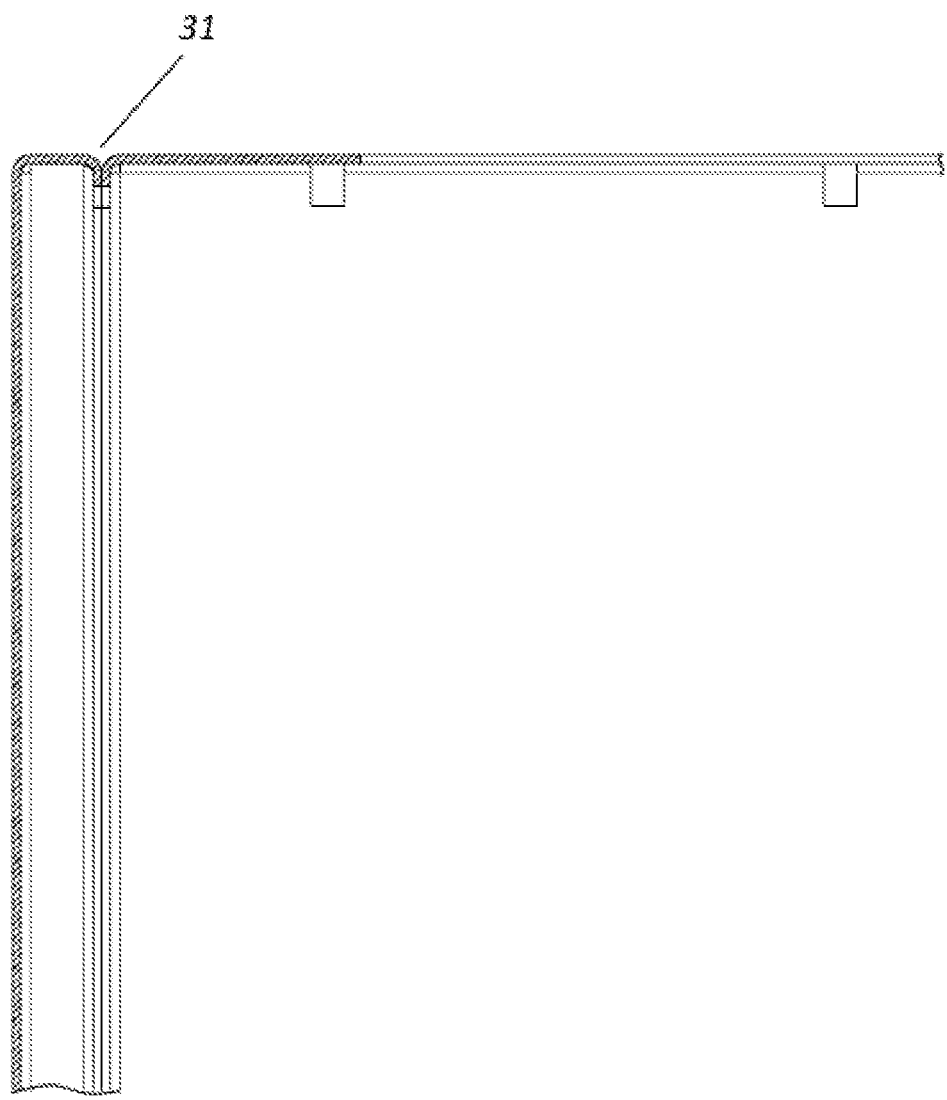
FIG. 9 illustrates an assembly of the cabinet with joined end-to-end metal sheets with curved joined ends which form strengthening ribs.

As it is shown in FIG. 9 cabinet 1 may be assembled with joined end-to-end metal sheets with curved joined ends which form strengthening ribs 31. Strengthening ribs 31 provides an increase design reliability of variable speed drive. This solution also reduces the metal consumption, improves the manufacturability of its production through the use of frameless manufacturing technology of cabinet 1.

Figure 10:
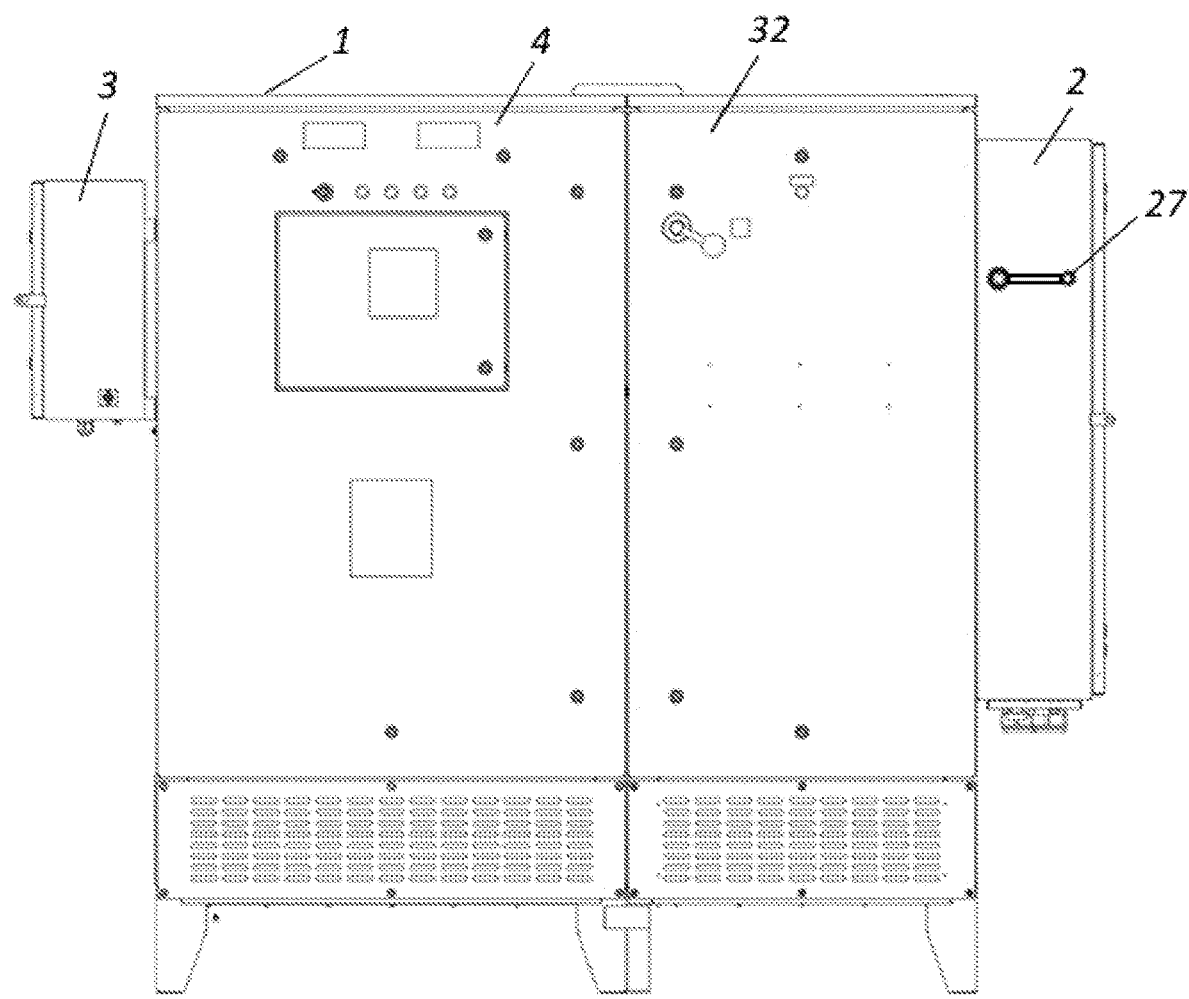
FIG. 10 illustrates the cabinet with an exemplary sell for installing a passive filter or a filter compensation device or a capacitor bank.

As it is shown in FIG. 10, cabinet 1 may comprise additional cell 32 for installing a passive filter or a filter compensation device or a capacitor bank. Such cells can be used to improve the reliability of power equipment elements of variable speed drive. Cell 32 may be demounted. Additional cell 32, for example, has a form of a cabinet of the same height and depth as cabinet 1. Additional cell 32 is constructed to be closely aligned with the cabinet of variable speed drive. Power connection 2 is located on a side of the additional cell 32. All connections between cabinet 1 of variable speed drive and additional cell 32 for installing a passive filter or a filter compensation device or a capacitor bank are made in the internal part of the embodiment.

According to FIG. 10, additional cell 32 can be connected to cabinet 1, for example, by bolting. This solution provides ease of transport and reduces the probability of damage if the device is improperly transported. Compact and ergonomic design provides quick replacement of components minimizing idleness. The design makes it possible to fully use the power of the generator, to reduce losses from higher harmonics and reactive currents. The use of embedded additional devices provides prevention of emergency shutdowns and turbine rotation. In addition, the staff is not forced to install a separate additional device and configure it for compliance with variable speed drive that may be accompanied by incorrect configuration. It also reduces the length of the power cables and provides placement of them inside the embodiment that protects against damage. At failure of an additional device, the variable speed drive can continue to operate.

Thus, the system can be adjusted to different power equipment elements of different variable speed drives. The system and its components as a whole ensure reliable operation of power equipment elements of variable speed drive.

Although the invention has been described in detail with reference to several embodiments, additional variations and modifications exist within the scope and spirit of the invention as described and defined in the following claims.

What is claimed:

1. System supporting variable speed drive comprising:
a three-sided service cabinet embodiment which is a vertically oriented rectangular parallelepiped and configured to provide an ability to installing tools for cooling, filtration, control, indication, power equipment elements and their connections, and includes a cell for installing a power connection and a cell for installing a measurement equipment on opposite sides,
wherein the cabinet comprising:
two heat exchange circuits limited by the basic elements of the cabinet embodiment, the first of which is configured to interact with an external environment and with the second heat exchange circuit, wherein the second heat exchange circuit which is configured without an ability to interact with external environment includes a sealed cell for installing power electronics and the cell for installing a power connection and the cell for installing a measurement equipment, where connection for heat exchange along the second circuit between said cells is provided through holes in the cells frames;
a dust and moisture filter placed at an inlet of air into the cabinet along the first heat exchange circuit and includes housing which includes mounting panels, an angle bar and protective panels;
wherein said protective panels are directed perpendicularly toward a direction of the first heat exchange circuit at an outlet of the dust and moisture filter and are made with multi-directional slopes in an internal part of the dust and moisture filter housing;
wherein said protective panels include dust and moisture protective elements in a shape of bended metal barriers;
wherein in a second slope of said protective panels, said metal barriers are made perpendicularly and in parallel toward the slopes of said panels, and in a third slope, said metal barriers are made perpendicularly toward the first heat exchange circuit direction;
wherein each first metal barrier located on the second slope of each protective panel configured to cover a part of the first heat exchange circuit passing between adjacent protective panels;
wherein each metal barrier located in parallel to the first heat exchange circuit on an adjacent panel below the first heat exchange circuit is projected at the same point relative to the first heat exchange circuit direction as a parallel barrier of an adjacent panel located above the first heat exchange circuit;
a plate heat exchanger installed between the first and the second heat exchange circuits and comprising a housing, elements for mounting, a gasket, a plurality of parallel metal plates and a plurality of plate couplers configured to create air paths for the interaction of the heat exchange circuits and installed between the metal plates;
wherein two air paths between at least three adjacent plates are created wherein a first air path provides air movement in the direction of the first heat exchange circuit and prevents air movement in the perpendicular direction of the second heat exchange circuit, and a second air path provides air movement in the direction of the second heat exchange circuit and prevents air movement in the perpendicular direction of the first heat exchange circuit;
a moisture removal device installed in the second heat exchange circuit and comprising a thermoelectric device and a partially permeable drainage element configured to let moisture out and prevent moisture inside the cabinet and installed under said thermoelectric device;
wherein said moisture removal device interacts with a cooler installed in the first heat exchange circuit;
a door configured to block access into the cabinet before and after disconnecting a supply voltage by means of a mechanical connector of a switcher of power electronics with a mechanical locking element of said door, and by means of an electromechanical locking mechanism, and by means of a power source of said electromechanical locking mechanism, and by means of door position sensors;
wherein said power source and the electromechanical locking mechanism are configured to control discharge voltage and to hold the door locking until the voltage drops to a safe value.

2. System supporting variable speed drive of claim 1, wherein the cabinet is assembled with joined end-to-end metal sheets with curved joined ends which form strengthening ribs.

3. System supporting variable speed drive of claim 1, wherein the plate heat exchanger includes polymeric plate couplers a cross section of which has a shape of a rectangle.

4. System supporting variable speed drive of claim 1, wherein the plate heat exchanger includes glass textolite plate couplers a cross section of which has a shape of an irregular figure.

5. System supporting variable speed drive of claim 1, wherein the plate heat exchanger includes metal plate couplers a cross section of which has a V-shape.

6. System supporting variable speed drive of claim 1, wherein the plate heat exchanger includes chamfers for mounting it into the cabinet, wherein the plate heat exchanger with chamfers is trapezoidal in shape.

7. System supporting variable speed drive of claim 1 further comprising a cell for installing a passive filter preconfigured for compliance with variable speed drive and configured in such a way that it is dismountable in a form of a cabinet of the same height and depth as the cabinet of variable speed drive and closely aligned with the cabinet of variable speed drive;
   wherein the cell for installing a power connection located on a side of the cell for installing a passive filter, wherein all connections between the cabinet of variable speed drive and the cell for installing a passive filter are made in the internal part of the embodiment.

8. System supporting variable speed drive of claim 1 further comprising a cell for installing a filter compensation device preconfigured for compliance with variable speed drive and configured in such a way that it is dismountable in a form of a cabinet of the same height and depth as the cabinet of variable speed drive and closely aligned with the cabinet of variable speed drive;
   wherein the cell for installing a power connection located on a side of the cell for installing a filter compensation device, wherein all connections between the cabinet of variable speed drive and the cell for installing a filter compensation device are made in the internal part of the embodiment.

9. System supporting variable speed drive of claim 1 further comprising a cell for installing a capacitor bank preconfigured for compliance with variable speed drive and configured in such a way that it is dismountable in a form of a cabinet of the same height and depth as the cabinet of variable speed drive and closely aligned with the cabinet of variable speed drive;
   wherein the cell for installing a power connection located on a side of the cell for installing a capacitor bank, wherein all connections between the cabinet of variable speed drive and the cell for installing a capacitor bank are made in the internal part of the embodiment.

* * * * *